United States Patent
Monichino (10) Patent No.: US 8,815,625 B2
(45) Date of Patent: Aug. 26, 2014

(54) SENSOR AND METHOD OF MANUFACTURE THEREOF

(75) Inventor: Massimo Monichino, Olgiate Comasco (IT)

(73) Assignee: Metallux SA, Mendrisio (CH)

( * ) Notice: Subject to any disclaimer, the term of this patent is extended or adjusted under 35 U.S.C. 154(b) by 65 days.

(21) Appl. No.: 13/810,385

(22) PCT Filed: Jul. 14, 2011

(86) PCT No.: PCT/IB2011/053154
§ 371 (c)(1),
(2), (4) Date: Mar. 14, 2013

(87) PCT Pub. No.: WO2012/007922
PCT Pub. Date: Jan. 19, 2012

(65) Prior Publication Data
US 2013/0168785 A1 Jul. 4, 2013

(30) Foreign Application Priority Data

Jul. 15, 2010 (IT) .............................. TO2010A0616

(51) Int. Cl.
*H01L 21/00* (2006.01)
*H01L 29/66* (2006.01)
*G01L 19/14* (2006.01)
*G01L 9/00* (2006.01)
*H01L 29/84* (2006.01)

(52) U.S. Cl.
CPC ........ *H01L 29/66007* (2013.01); *G01L 19/147* (2013.01); *G01L 9/0052* (2013.01); *H01L 29/84* (2013.01); *G01L 19/148* (2013.01)
USPC .................. 438/51; 257/51; 257/53; 257/414; 257/E51.04; 438/49; 438/780; 438/779; 438/195

(58) Field of Classification Search
CPC ..................................................... G01P 15/00
USPC ........ 257/53, 414, 253, 798, E51.04; 438/21, 438/49, 780, 779, 195–197
See application file for complete search history.

(56) References Cited

U.S. PATENT DOCUMENTS

| | | |
|---|---|---|
| 5,142,915 A | 9/1992 | Bergstrom |
| 5,285,690 A | 2/1994 | Koen et al. |
| 5,407,501 A | 4/1995 | Koen et al. |
| 5,634,999 A | 6/1997 | Takeuchi et al. |
| 7,513,164 B1 | 4/2009 | Khemet et al. |
| 2008/0202250 A1 | 8/2008 | Koehler |

FOREIGN PATENT DOCUMENTS

| | | |
|---|---|---|
| EP | 0 553 725 A2 | 8/1993 |
| EP | 0 701 112 A2 | 3/1996 |

OTHER PUBLICATIONS

International Search Report (PCT/ISA/210) and Written Opinion of the International Searching Authority (PCT/ISA/237) for corresponding PCT International Application No. PCT/IB2011/053154 filed Jul. 14, 2011, completed on Oct. 20, 2011 and mailed on Oct. 28, 2011.

*Primary Examiner* — Mark A Laurenzi
(74) *Attorney, Agent, or Firm* — Heslin Rothenberg Farley & Mesit P.C.; Victor A. Cardona, Esq.

(57) ABSTRACT

A pressure sensor having a structure, which includes a supporting body, a circuit arrangement and at least one circuit support. The circuit arrangement includes circuit components, amongst which detection means for generating electrical signals representing a quantity to be detected. The at least one circuit support is connected to the supporting body and has a surface, formed on which is a plurality of said circuit components, amongst which electrically conductive paths, where the circuit support is laminated on the first face of the supporting body.

17 Claims, 10 Drawing Sheets

SENSOR AND METHOD OF MANUFACTURE THEREOF

CROSS-REFERENCE TO RELATED APPLICATIONS

This application is a 371 National Phase of PCT/IB2011/053154 filed on Jul. 14, 2011, which claims priority to Italian Patent Application No. TO2010A000616 filed on Jul. 15, 2010, the entire disclosures of which are incorporated herein by reference.

FIELD OF THE INVENTION

The present invention relates in general to sensors of the type having:
- a structure, which comprises a supporting body;
- a circuit arrangement, comprising circuit components, amongst which detection means for generating electrical signals representing a quantity to be detected; and
- at least one circuit support, fixed to the supporting body and having a surface, formed on which is a plurality of the aforesaid circuit components, amongst which electrically conductive paths.

The invention, which in any case can be applied to various types of sensors, has been developed with particular reference to a pressure sensor, in which a membrane is subjected to elastic deformation as a function of the pressure of a fluid being measured, and the circuit components comprise detection means for generating electrical signals representing the deformation of the aforesaid membrane.

PRIOR ART

Sensors of the type referred to are used in devices for detecting the pressure of fluids (liquids and aeriforms) in various sectors. These detection devices typically comprise a casing, defining a chamber having an inlet for a fluid the pressure of which is to be measured, and a pressure sensor housed in the chamber.

In a first type of solutions, the sensor has a body having structural functions, which defines a membrane that is to be exposed to the fluid. On the membrane, which is at least in part made of an electrically insulating material (for example, a ceramic material or a metal material coated at least partially by an insulating layer), the detection means, configured for detecting a bending or elastic deformation of the membrane itself, are set or extend at least partially. The detection means are typically constituted by resistive, capacitive, or piezoresistive elements, for example a resistor bridge.

The sensor generally also comprises a circuit, at least partially housed in the chamber of the casing of the device, in a position isolated with respect to the inlet for the fluid. In some cases, the body of the sensor, which is made of electrically insulating material in one or more parts, itself supports the circuit arrangement, configured for treating the signal indicating bending of the membrane, and hence the pressure of the fluid. This circuit arrangement typically consists of a printed-circuit board made of glass-reinforced plastic, formed on which is an electrical circuit pattern, including a plurality of paths made of electrically conductive material. On the printed-circuit board there can be mounted or formed various circuit components, such as capacitors, resistors, integrated circuits, connected to the aforesaid paths. The printed-circuit board is anchored in a position set at a distance from the membrane and connected so as to handle the signals generated following upon deformation of the membrane. In some cases, circuit components of the arrangement, such as the connection paths and the detection means, are formed via serigraphic deposition directly on one face of the body of the sensor, when this is made of electrically insulating material. In the case of a metal body, the aforesaid face is to be at least partially coated by a layer of insulating material, which can itself be deposited via serigraphy, prior to deposition of the materials necessary to obtain the circuit and the detection means.

In a second type of known solutions, the sensor includes a chip or die of semiconductor material, typically silicon, which defines the detection membrane and in which a miniaturized electronic circuit is directly defined. In these solutions, the functions of the membrane and of the detection means are integrated in one and the same component, namely the die. The sensor includes a body or substrate, provided with a through opening. One end of said opening is designed to be set in communication with a fluid circuit, located in which is the fluid the pressure of which is to be measured, whilst at the opposite end of the opening the die is mounted in a sealed way so that its membrane will substantially face said end of the opening. Also in these solutions, a printed-circuit board made of glass-reinforced plastic in which a circuit arrangement is formed, including electrically conductive paths that are connected to the die, can be fixed on the body or substrate.

When the substrate is made of insulating material, for example ceramic material, the aforesaid circuit arrangement can be directly formed thereon via serigraphy. In the case of an electrically conductive substrate, between the components of the circuit arrangement and the substrate there must be provided at least one insulating layer, which can also be deposited via serigraphy.

The solutions in which a circuit board is fixed or connected externally to the supporting body of the sensor usually present the advantage of making available a greater area for arranging the necessary circuit elements, but the disadvantage of requiring an additional substrate, of having to connect it to the sensor, and of having generally greater total heights. Also the solutions in which a number of components of the circuit arrangement—such as conductive paths, connection contacts, detection elements—are formed directly on the supporting body via deposition of material present certain drawbacks.

Serigraphic deposition presupposes pre-arrangement of a plurality of screens or masks, each defining the layout of a respective part of the circuit, such as the paths, the resistors, the contacts for the external connection of the sensor, the possible insulating layer, etc. Each mask is to be used each time for serigraphing simultaneously a limited number of supports at a time, frequently even just one support, to obtain a good quality of deposition on the individual sensor, with low production yields. After each deposition, and before the next one, the supporting body must moreover be subjected to drying to eliminate the solvents used in the ink and bring about consolidation of the material deposited.

U.S. Pat. No. 5,142,915 A discloses a method for fabricating force sensor elements, wherein un unfired ceramic tape is fired after having been laminated on a laminar substrate and thereafter on the fired tape a system of conductors and resistors is formed, which is subsequently fired.

U.S. Pat. No. 7,513,164 B1 discloses a process for fabricating an ATF (advanced thick film) pressure transducer. On a flexible metallic substrate at least one dielectric layer is deposited and thereafter a conductor layer is deposited on the at least one dielectric layer. On the conductor layer are then deposited circuit components and finally a protecting overglaze. The dielectric layer or layers can be deposited on the metallic substrate using a number of techniques such as printing, evaporative deposition, chemical deposition, lamination.

SUMMARY AND AIM OF THE INVENTION

The present invention has basically the aim of providing sensors, in particular pressure sensors, that are simpler, more convenient, and faster to produce as compared to the prior art, and hence at more contained costs. Within this framework, an aim of the invention is to indicate a particularly advantageous method for manufacturing such sensors. Another aim of the invention is to provide sensors the structure of which includes a supporting body, to which a circuit support is rigidly connected in a stable way, that is resistant to the various conditions of use and/or to relatively high temperatures.

The above and yet further aims, which will emerge hereinafter, are achieved according to the invention by a method for manufacturing pressure sensors and by a pressure sensor having the characteristics specified in the annexed claims, which form an integral part of the technical teaching provided in relation to the invention.

BRIEF DESCRIPTION OF THE DRAWINGS

Further purposes, characteristics, and advantages of the present invention will emerge clearly from the ensuing detailed description and the annexed drawings, which are provided purely by way of explanatory and non-limiting example and in which.

DESCRIPTION OF PREFERRED EMBODIMENTS OF THE INVENTION

Reference to "an embodiment" or "one embodiment" in the framework of the present description indicates that a particular configuration, structure, or characteristic described in relation to the embodiment is comprised in at least one embodiment. Likewise, phrases such as "in an embodiment" or "in one embodiment" and the like that may be present in various points of the present description do not necessarily all refer to one and the same embodiment. Furthermore, the particular configurations, structures, or characteristics can be combined in any adequate way in one or more embodiments. The references used in what follows are merely provided for convenience and do not define the sphere of protection or the scope of the embodiments.

In the sequel of the present description, terms such as "top" and "bottom" are to be understood as mere non-limiting spatial references to facilitate the description of the items illustrated in the figures.

In what follows, preferred applications will be described, with reference to the production of pressure sensors, bearing in mind, however, that the invention can be applied also for the production of other types of sensors.

Figure 1:
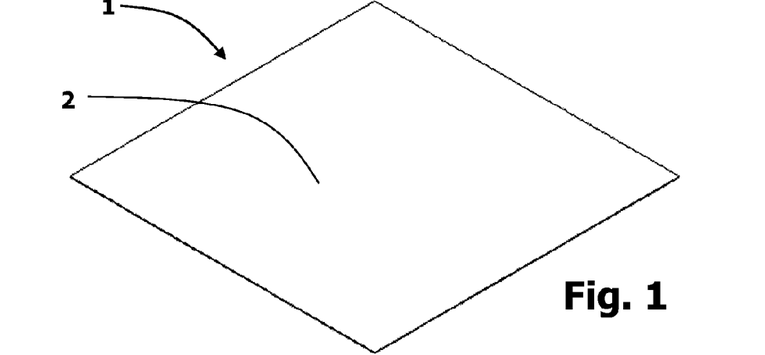
FIG. 1 is a schematic perspective view of a tape of dielectric material, used for production of sensors according to the invention.

Designated as a whole by 1 in FIG. 1 is a length of a tape of dielectric or insulating material, used for production of a pressure sensor in accordance with an advantageous application of the invention.

In general terms, the main component or components of the tape 1 is/are of a ceramic nature and/or oxides, in combination with suitable binders, dispersants, and solvents. In a preferred embodiment of the invention, for example, the main component of the tape is aluminium oxide, in particular alumina, in percentages indicatively comprised between 10 wt % and 25 wt %. As an alternative to or in combination with aluminium oxide, the composition of the tape can include as components silica, zinc oxide, zirconium silicate, frits or powdered glass.

The tape 1 can be obtained, for example, with the tape-casting technique (see, for example, "*Principles of ceramics processing*", 2nd ed., J. S. Reed. J. Wiley & Sons, 1995), starting from a liquid mixture, comprising ceramic powders, for example alumina and glass, mixed with the binders, dispersants, and solvents in an organic vehicle or in water. The mixture is constituted, indicatively, for one half (in volume) by liquid, for one third by the powders, whilst the remainder comprises the additives.

A tape that can be used for implementation of the present invention is, for example, the one marketed by W. C. Heraeus GmbH under the trade name "HERATAPE". A further type of tape that can be used may, for example, the one marketed by DuPont under the trade name "GreenTape". Not excluded from the scope of the invention is the use of other tapes for LTCC and HTCC applications.

Typically, the thickness of the tape 1 is comprised between 0.05 mm and 0.3 mm (it being possible, however, to have also thicknesses of up to 1 mm or larger) and is flexible, i.e., it can be wound in rolls, and can hence possibly be associated also to curved or irregular surfaces on a support or substrate.

For the purposes of production of the sensors, the tape is conveniently provided in relatively large lengths 1, for example with dimensions indicatively comprised between approximately 50×50 mm or 100×100 mm, in particular approximately 50.8×50.8 mm or 101.6×101.6 mm.

Deposited directly, preferably via the serigraphic or jet-deposition technique, on each length of tape 1 is the material necessary for obtaining of circuit components of the sensors to be produced. In particular, as exemplified in FIG. 2, on the top face 2 of a length of tape 1 there is obtained a plurality of circuit patterns, or conductive paths, or electrical elements, designated as a whole by 3, substantially of a thick-film type. FIG. 3 illustrates by way of example a basic circuit pattern that includes electrically conductive paths 3a and pad terminals, for the external connection of the sensor, designated by 3b.

A first material deposited, for example in the form of paste or ink, preferably has a base of one or more metals selected from among gold, silver, platinum, palladium, copper, possibly mixed to glass frits (or lead oxides) and/or silica (or silicon oxides), with suitable binders and solvents. One or more solid components of the aforesaid first material, for example the metal components, can advantageously comprise particles having micrometric or nanometric dimensions, preferably characteristic dimensions of less than 1 µm; said particles are preferably mixed with at least one substance designed to form with them a fluid or liquid solution, such as a solvent, for example a ketonic solvent. Such a type of material enables an improved adhesion to be obtained between the nanoparticles in the microporosities or microrugosities of the material that constitutes the tape 1. In the possible steps of drying and/or baking and/or sintering that follow deposition, moreover, the various materials can fuse and/or bind to one another, even to form mechanical and/or chemical and/or electrical bonds between the materials and/or pastes and/or inks and/or with the tape 1. This is facilitated by the micrometric or nanometric structures of the particles contained in the materials or pastes or inks, which enable or facilitate said mechanical and/or chemical and/or electrical bonds.

The circuit pattern can be obtained with just one deposition pass or with a number of passes according to the complexity of the layout and/or of the possible use of different materials. For instance, the paths 3a and the terminals 3b can be made of one and the same material, with a single serigraphic or jet-deposition pass; in the case where the paths and the terminals are to be made of different materials, two serigraphic or jet-deposition passes can be envisaged. Irrespective of the number of serigraphic or jet-deposition passes, each of them is preferably followed by a step of drying of the length of tape, for burnout of the solvents, there being, however, possibly envisaged a single final drying step.

Figure 2:
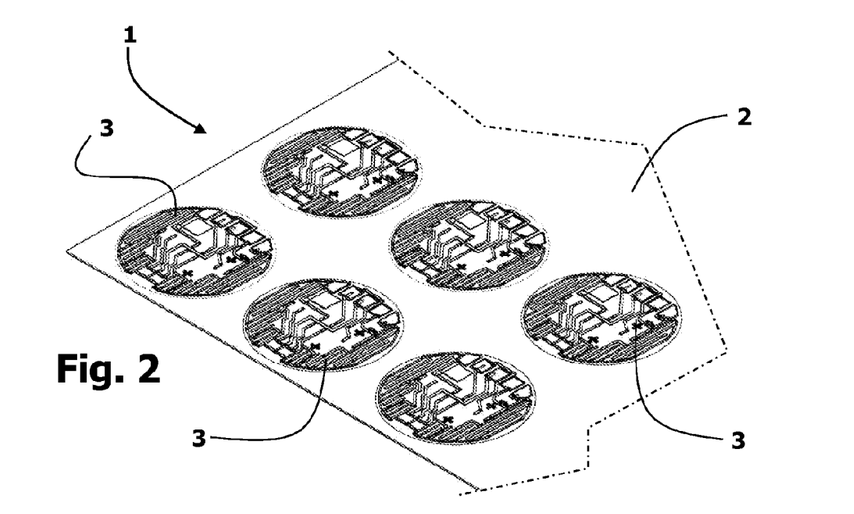
FIG. 2 is a partial perspective view of a tape of the type illustrated in FIG. 1, at a larger scale, on which a plurality of circuit patterns are directly formed.
Figure 3:
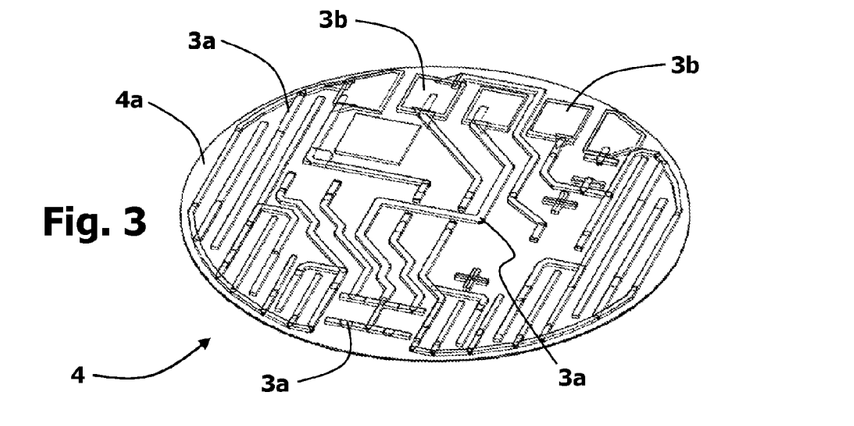
FIG. 3 is a perspective view of a single portion of the tape of FIG. 2, including a respective circuit arrangement.

As may be seen from FIG. 2, the deposition pass or passes are executed so as to obtain simultaneously on the length of tape 1 a plurality of circuit patterns 3, arranged according to a substantially regular array.

After the drying step, or the last drying step envisaged, the length of tape 1 is subjected to singulation, namely a process of removal of the individual circuit patterns 3 from the length of tape 1, as may be seen in FIG. 3, to obtain corresponding basic circuits, designated by 4. The separation of the circuits 4 can be obtained, for example, via shearing or punching.

Each basic circuit 4 hence comprises a corresponding portion of the tape 1, designated by 4a, which provides a circuit support, on the top face of which the circuit pattern 3 is present. In the example, the circuits 4 are generally disk-shaped, but said shape is evidently not to be understood as in any way limiting.

In the case of the first embodiment, the structure of the sensor comprises a (preferably but not necessarily monolithic) supporting body made of electrically conductive material, such as a metal, for example steel, or a conductive polymer.

Figure 4:
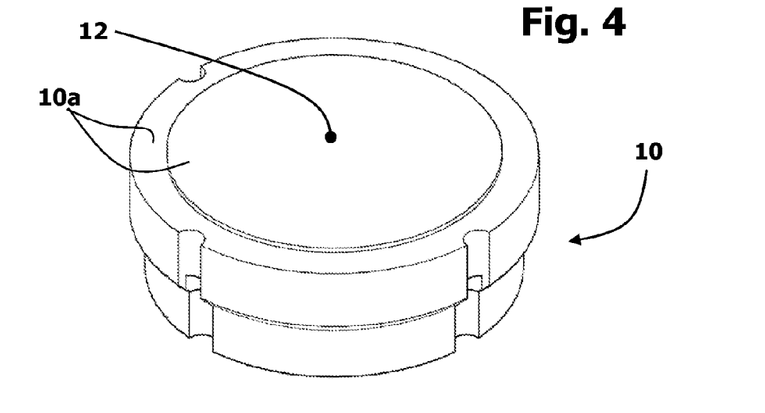
FIGS. 4 and 5 are a schematic perspective view and a schematic cross-sectional view, respectively, of an electrically conductive supporting body of a pressure sensor in accordance with a first embodiment of the invention.
Figure 5:
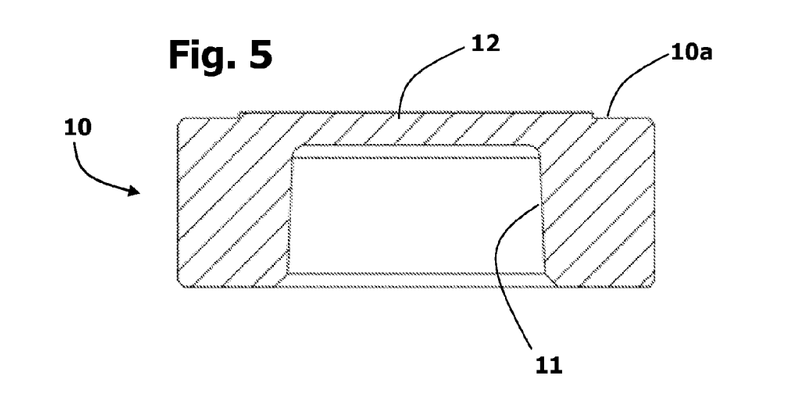

Such a steel body is represented by way of example in FIGS. 4 and 5. In the example, the body, designated as a whole by 10, has an overall cylindrical shape, with a blind cavity 11, which is closed at one end by a membrane portion 12. The membrane portion, hereinafter defined for simplicity as "membrane", can indicatively have a thickness comprised between 0.05 mm and 4 mm, preferably a thickness comprised between 0.1 mm and 2 mm, and in any case such as to be able to bend or undergo elastic deformation under the pressure of a fluid.

The membrane 12 is defined at a top face 10a of the body 10, on which a corresponding basic circuit 4 is to be constrained in a fixed position. According to one aspect of the invention, the circuit 4 is constrained directly to the face 10a without the use of glues or adhesives. More in particular, according to the invention, the circuit 4 is associated to the face 10a via lamination.

Figure 6:
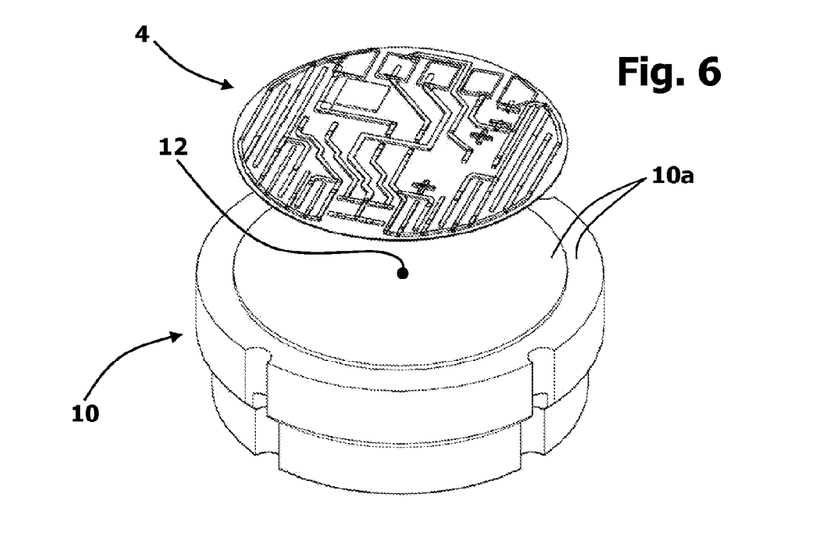
FIGS. 6-7 are schematic illustrations of a step of combination of the tape portion of FIG. 3 with the supporting body of FIGS. 4-5.

The process of lamination is a hot process carried out using a press. With this processing step, positioned on the top faces of a plurality of bodies 10, kept in position via suitable positioning templates, are the corresponding circuits. The pressure exerted in the lamination step is indicatively comprised between 2500 and 3500 psi, preferably between 2000 and 3000 psi, for a time indicatively comprised between 5 and 15 minutes; the process temperature is indicatively comprised between 70° C. and 80° C.

Figure 7:
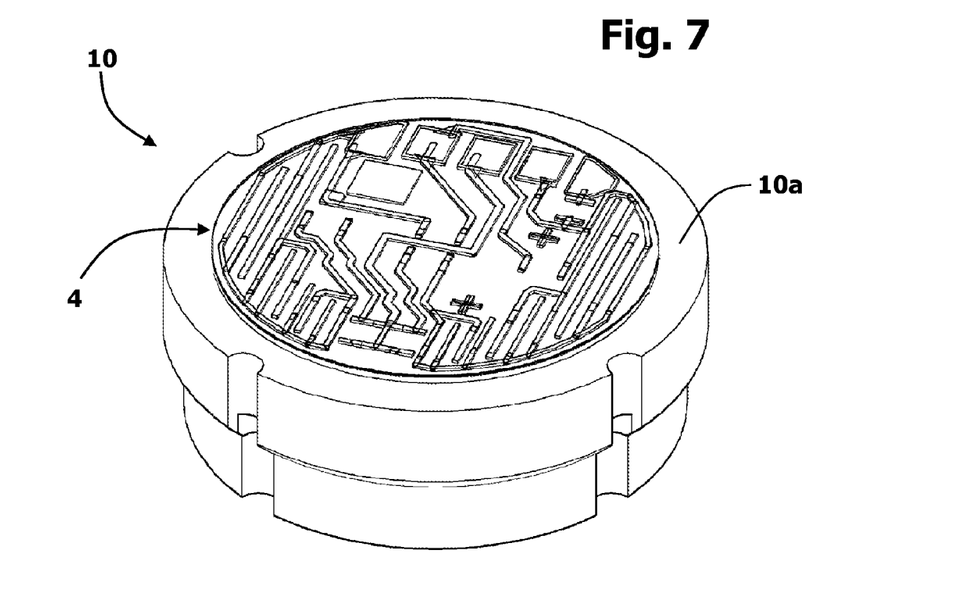

The result of the lamination of a circuit 4 on the corresponding body 10 is illustrated schematically in FIG. 7. The lamination is followed by a baking step, at a temperature indicatively comprised between 800° C. and 900° C. Following upon said step, the circuit 4 is firmly fixed to the face 10a, in particular without the aid of interposed glues.

In the example, represented for practical purposes is a lamination on a plane surface or face 10a. According to the invention, a sensor can, however, be provided that involves a lamination on a curved or irregular surface or face of a body or substrate having a configuration different from the one represented. For this purpose, the lamination or press system can envisage appropriately shaped lamination surfaces, for example with a shape complementary to that of the face to be laminated, or else the press can be configured for automatic adaptation to said face, for example be of the type defined as "isostatic press", such as a press designed to carry out a lamination via the thrust and/or pressure of a fluid, which can be uniformly exerted on the face or surface to be laminated. Consider, for example, lamination of a sensor on at least part of a cylindrical surface, such as the wall of a tube.

Next, the deposition on the basic circuit 4, fixed with respect to a single body 10, of further circuit components is performed, for example via serigraphy or jet deposition. In the example, said components comprise a plurality of detection elements, which are formed in a substantially central region of the circuit 4, i.e., a region that is set on top of the membrane 12. In the case of a pressure sensor, these detection elements can be constituted by resistive, piezo-resistive or capacitive elements. Assume, with reference to the example described herein, that said elements are constituted by resistors, designated by 3c in FIG. 8, which form, together with corresponding paths 3a, a resistive bridge. In the course of one and the same deposition step, or in a subsequent step, further components can be formed on the basic circuit 4, such as for example offset-calibration resistors, designated in FIG. 8 by 3d. Said further components, or the detection elements themselves, could be deposited on the basic circuit 4 before this is laminated on the corresponding body 10.

The material deposited for providing the resistors 3c, 3d may be in the form of resistive or piezo-resistive paste or ink, preferably with a base of one or more metals selected from among ruthenium, bismuth, silver, palladium, lead, in particular in the form of oxides. Also in this case, the paste or ink preferably includes silica (or silicon oxides) or glass frits (or lead oxides), with suitable binders and solvents (solvents of a terpinol type). This second deposited material can have characteristics in common with those described with reference to the aforesaid first material; for example, they may include particles of micrometric or nanometric dimensions, preferably having sizes at least smaller than 1 µm, preferably mixed with at least one substance designed to form with them a fluid or liquid solution. Also such a second material, i.e. its particles, enables an improved adhesion or bond to be obtained, such as mechanical and/or chemical and/or electrical bonds between the materials and/or pastes and/or inks and/or the tape 1.

Figure 8:
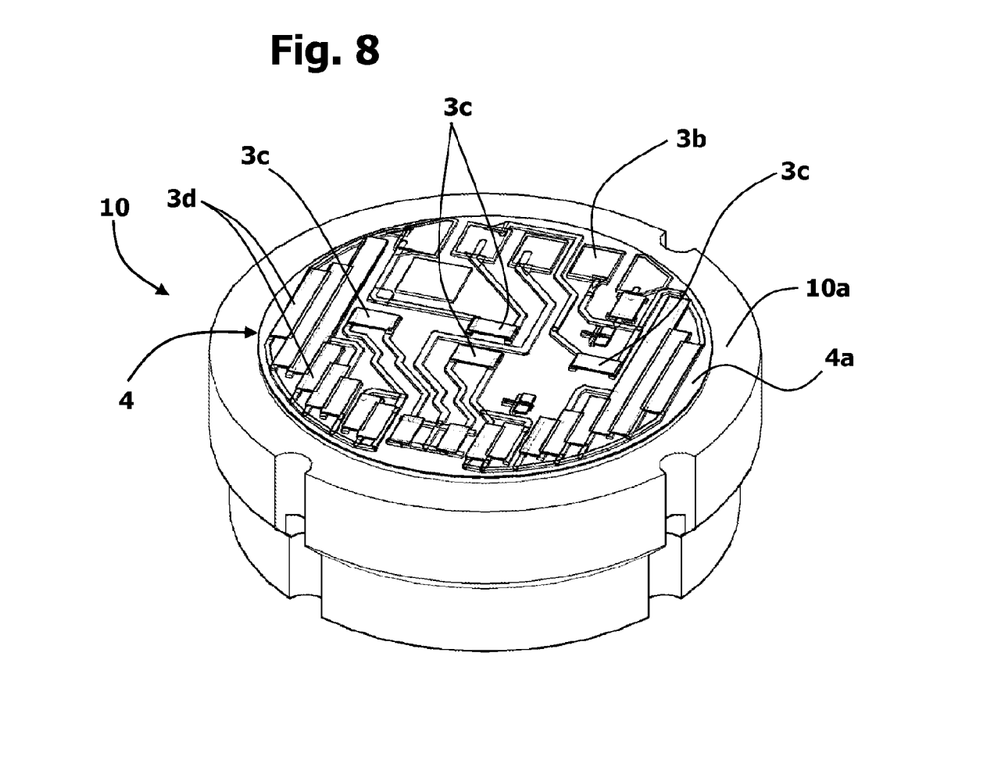
FIG. 8 is a schematic illustration of a further step of manufacture of the sensor in accordance with the aforesaid first embodiment of the invention.

After formation of the resistors 3c. 3d, the semifinished product is preferably subjected to a step of drying and baking of the resistive paste, at the end of which the pressure sensor is obtained, as may be seen in FIG. 8.

The fact that the circuit 4 is constrained via lamination to the body 10 enables an optimal adhesion of the circuit support 4a on the membrane 12 and a possible high degree of planarity thereof to be obtained in the case illustrated. Thanks to this solution, a high degree of stability of the measurement bridge is guaranteed, here constituted by the resistors 3c, in so far as the resistors themselves are deposited on a dimensionally stable material, rendered firmly fixed with respect to the body 10 and, in the case in point, on a planar surface.

The proposed solution moreover enables optimization of the deposition passes; i.e., it enables, for example, simultaneous deposition of a number of circuits separately with respect to the corresponding supporting bodies (in other words, the circuit arrangements for n sensors are deposited in a single step on one and the same tape, and not deposited individually on a plurality of individual supporting bodies). The use of a circuit support constituted by a length of tape of dielectric material avoids the need, which is typical of the known art, to lay on the body 10 an insulating layer, for example an oxide layer, deposited directly on the face 10a of the body. The tape moreover enables fixing of the circuits 4 to the body 10 in a reliable way, in particular without the use of interposed glues, thereby obtaining circuits having a substrate 4a of stable dimensions and/or having good characteristics of insulation, even at relatively high temperatures.

Another advantage of the solution is that the number of baking operations to which the body 10 has to be subjected is reduced, to the benefit of the production process.

In the embodiment exemplified, the detection elements 3c and the possible other deposited circuit components 3d are formed on the basic circuit 4 after lamination. In a possible variant, on the other hand, also said components can be formed directly on the circuit support 4a prior to lamination. This variant embodiment requires greater precision in the lamination step on account of the thickness of the resistors (which is comparatively greater than that of the paths 3a and the terminals 3b). In order to prevent the risk of undesirable variations of the dimensions determined in the stage of design of said components, the press used will be provided with systems—for example, with air (or other fluid) bearings—that will enable a uniform and precise distribution of the load applied in the course of the lamination. The increase of cost due to the greater complexity of the press is on the other hand balanced by the advantage of preventing a deposition of the components 3c, 3d on individual circuit supports 4a already associated to the corresponding bodies 10.

General operation of the pressure sensor according to the non-limiting example of the invention provided herein is obtained according to known modalities, and consequently will not be described in detail herein. In general terms, in practical use the sensor can be mounted within a device for the detection of the pressure of fluids (liquids and aeriforms), for example for use in the automotive sector, or in the domestic and electrical-household-appliance sector, or in the sector of environmental and hydro-thermo-sanitary conditioning in general, or in the medical sector. Such a device has a casing defining an inlet that receives a fluid the pressure of which is to be detected, the sensor being mounted in the casing so that the face of the membrane 12 opposite to the circuit 4 will be exposed to the fluid, via the cavity 11. The mechanical deformation of the membrane 12, due to the pressure of the fluid being measured, modifies the value of resistance at output from the resistor bridge 3b, with the corresponding signal that is processed according to known modalities.

The solution according to the invention can be applied also to the case of sensors the structure of which includes a supporting body made of electrically insulating material. Such an embodiment is exemplified in FIGS. 9-13, which use the same reference numbers as those of FIGS. 1-8 to designate elements that are technically equivalent to the ones already described above.

Figure 9:
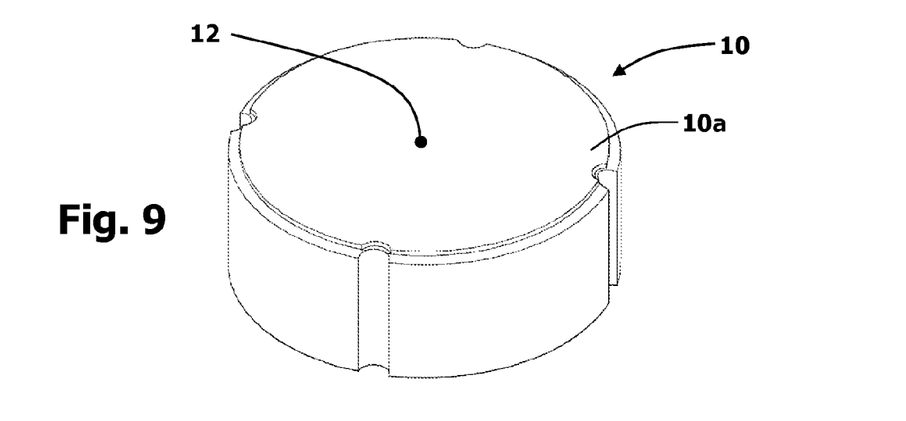
FIGS. 9 and 10 are a schematic perspective view and a schematic cross-sectional view, respectively, of an insulating supporting body of a pressure sensor in accordance with a second embodiment of the invention.
Figure 10:
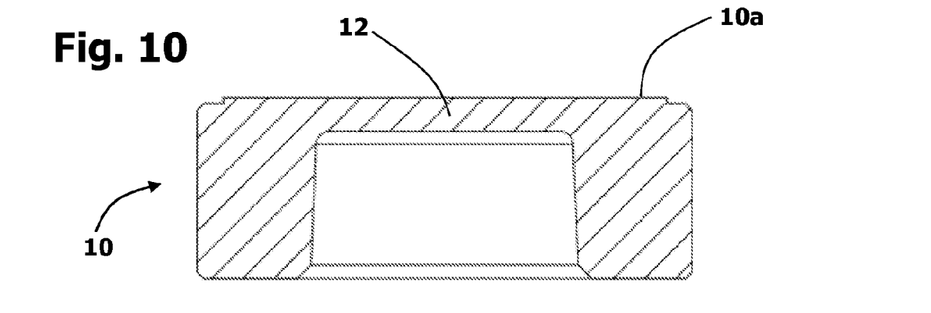
Figure 11:
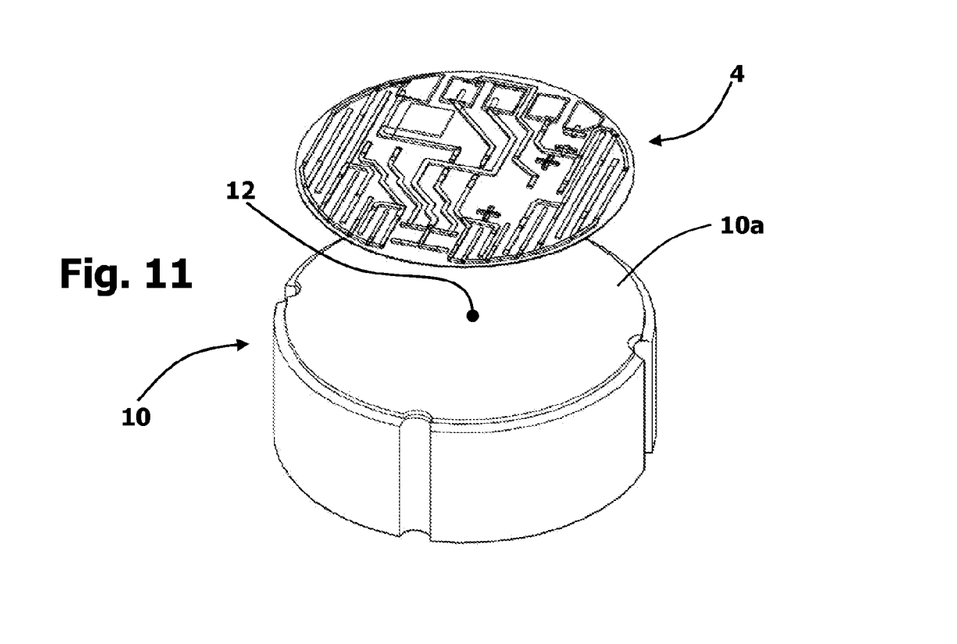
FIGS. 11-13 are views similar to those of FIGS. 6-8, corresponding to the sensor in accordance with the aforesaid second embodiment of the invention.
Figure 12:
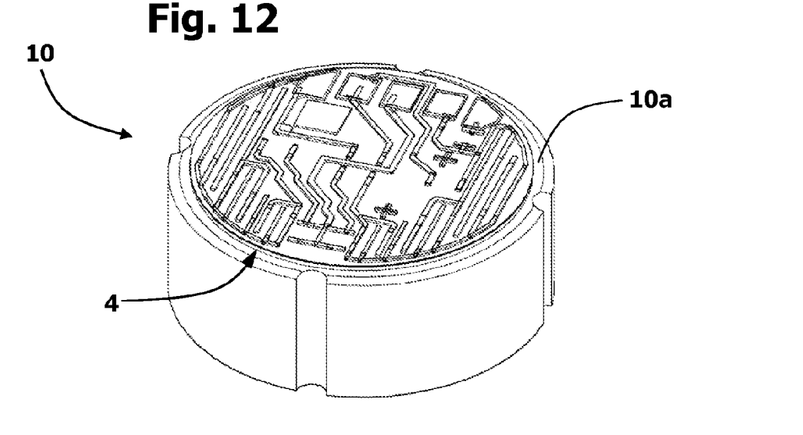

Hence, designated by 10 in FIGS. 9 and 10 is a body for supporting the sensor, preferably but not necessarily of a monolithic type, made of an electrically insulating material, such as a ceramic material, glass, a material with a base of one or more oxides, such as an aluminium oxide or a polymer. In what follows, it will be assumed that the body 10 of the second embodiment is made of a ceramic material, for example alumina.

In the example, the body 10 has a shape generally similar to that of the body 10 of the first embodiment. In this case, the thickness of the membrane 12 can be indicatively comprised between 0.05 mm and 5 mm, preferably between 0.1 mm and 3 mm.

Figure 13:
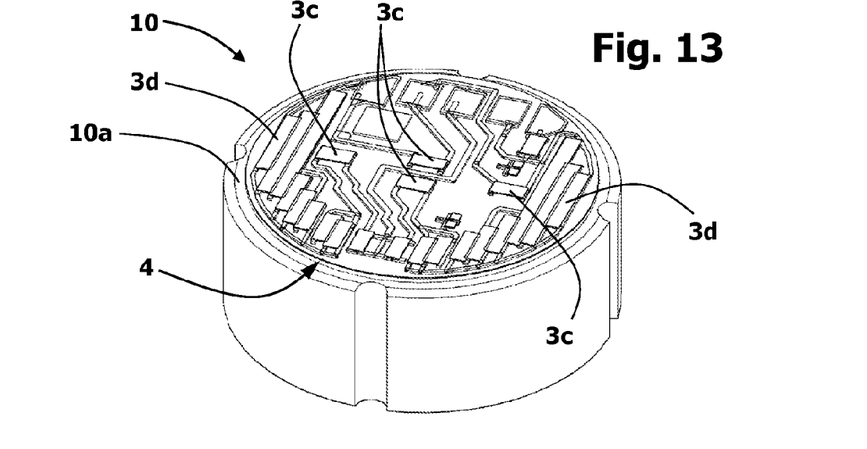
Figure 14:
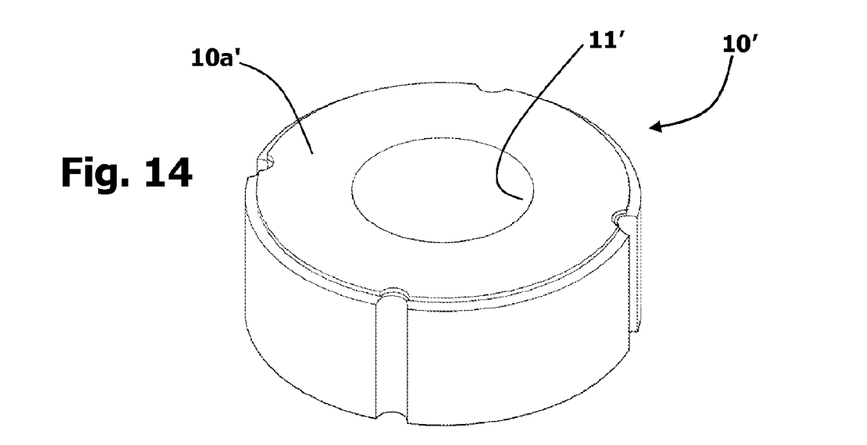
FIGS. 14 and 15 are a schematic perspective view and a schematic cross-sectional view, respectively, of a supporting body of a pressure sensor in accordance with a third embodiment of the invention.
Figure 15:
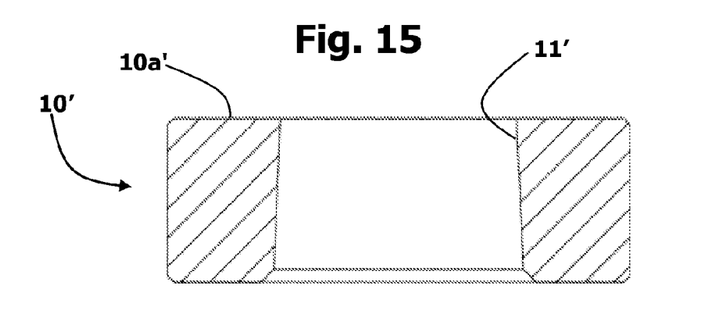
Figure 16:
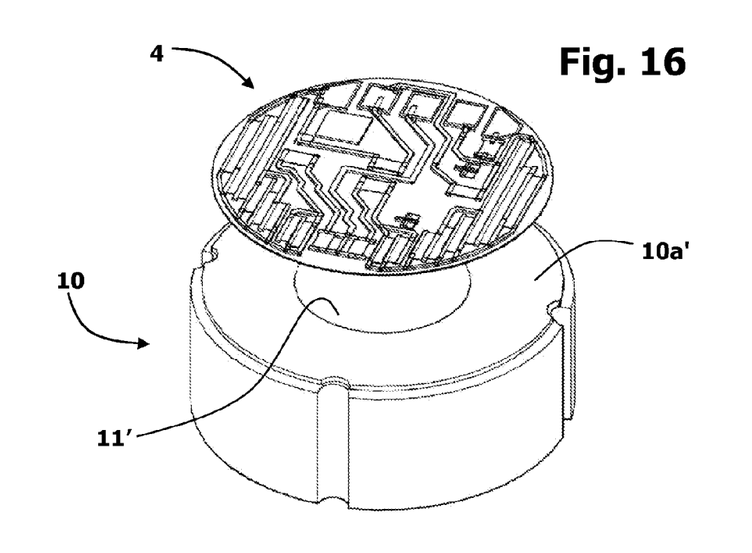
FIGS. 16-18 are views similar to those of FIGS. 6-8 and 11-13, corresponding to the sensor in accordance with the aforesaid third embodiment of the invention.
Figure 17:
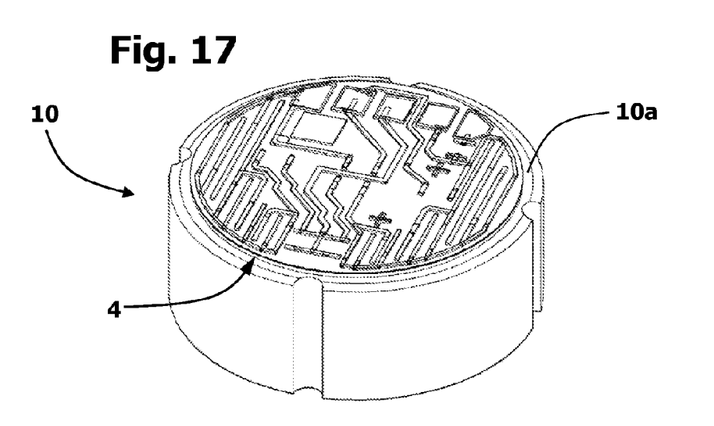

The materials and/or the steps for obtaining the basic circuit 4 are similar to the ones described previously with reference to FIGS. 1-3. After obtaining the basic circuit 4, this is laminated on the top face 10a of the ceramic body 10, as exemplified in FIGS. 11 and 12. The corresponding operations of baking of the semifinished product is followed by the deposition step, for example via serigraphy, of the resistors 3c, 3d (and/or of other circuit components), which is possibly followed by the corresponding drying and baking steps, until the sensor illustrated in FIG. 13 is obtained.

Of course, also in this case it is possible to proceed to deposition of the detection means 3c and the possible other circuit components 3d prior to the lamination step, as mentioned previously in relation to the previous embodiment.

The advantages of the second embodiment are basically the same as those of the first embodiment. The use of a ceramic supporting body 10 moreover has the effect of improving adhesion of the circuit support 4a to the face 10a of the body 10, thanks to the fact that the ceramic material has surface microporosities that are more pronounced as compared to the steel of the first embodiment and/or presents a better compatibility of the material of the tape 1 with the material of the body 10, preferably enabling the corresponding mechanical and/or chemical bonds to be obtained, in particular during the lamination step and/or the baking or sintering step.

In FIGS. 14-18, which use the same reference numbers as those of FIGS. 1-8 to designate elements that are technically equivalent to the ones already described above, a third embodiment of the invention is represented, based upon the same concepts already highlighted previously.

The sensor according to the third embodiment differs from those of the two previous embodiments substantially as regards the shape of the supporting body. As may be seen in FIGS. 14 and 15, in this case the supporting body, designated by 10', has a generally cylindrical shape. i.e. provided with a through axial cavity 11'.

Figure 18:
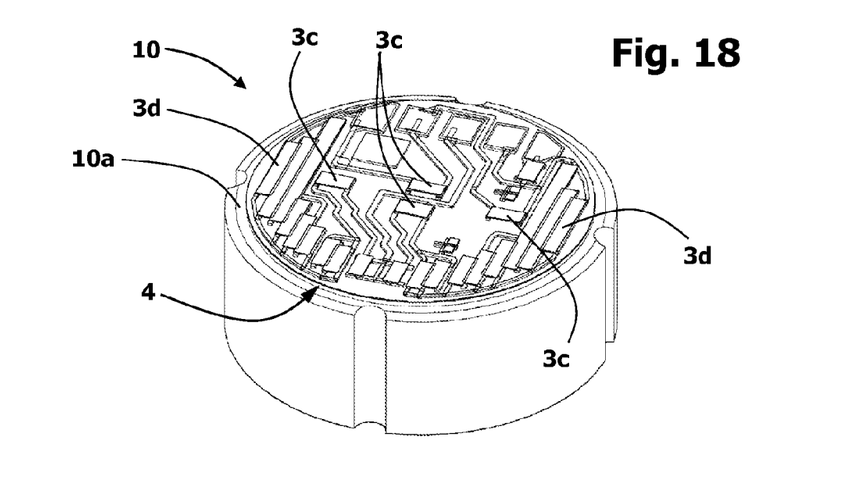
Figure 19:
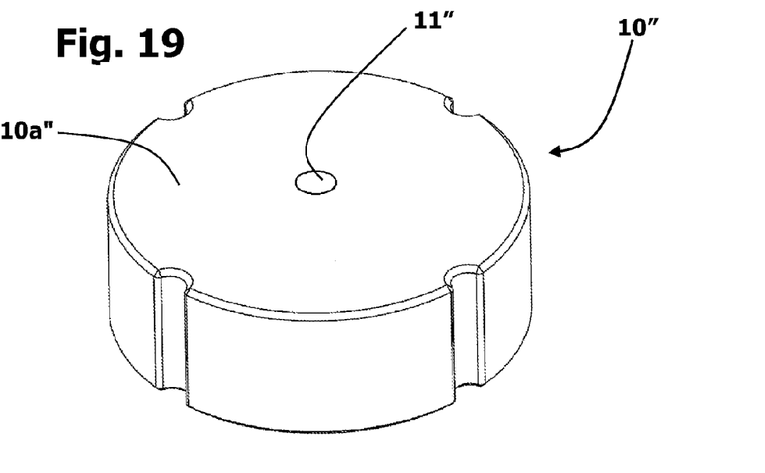
FIGS. 19 and 20 are a schematic perspective view and a schematic cross-sectional view, respectively, of a supporting body of a pressure sensor in accordance with a fourth embodiment of the invention.
Figure 20:
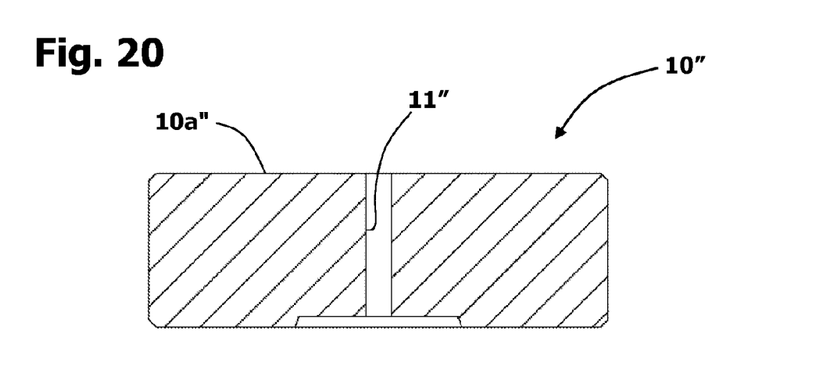
Figure 21:
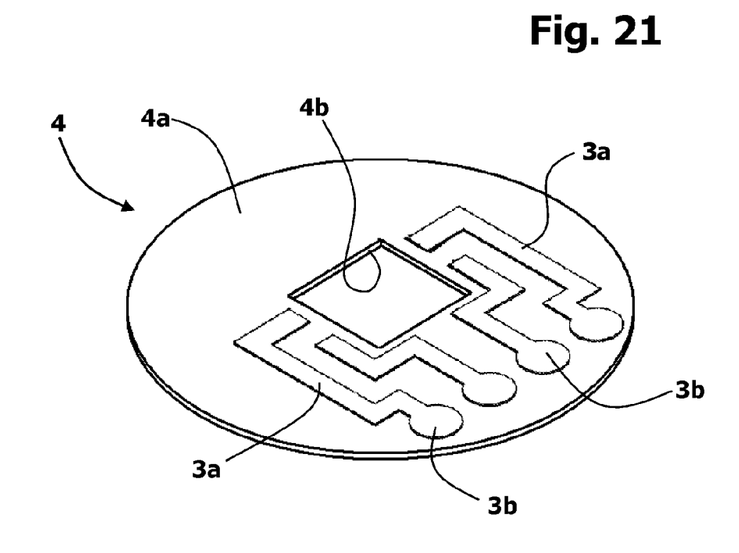
FIG. 21 is a perspective view of a single portion of a tape of the type illustrated in FIG. 3, but differently processed for the purposes of implementation of the aforesaid fourth embodiment of the invention.

Also in this embodiment, on the top face 10a' of the body 10' a basic circuit 4 obtained as described previously (FIG. 16) is laminated so that its central region closes the cavity 11' at one end, facing it directly. Before or after the basic circuit 4 has been laminated on the body 10' (FIG. 17) there is the step of deposition of the components 3c, 3d, to obtain the sensor as illustrated in FIG. 18, and this is possibly followed by the corresponding drying and/or baking steps.

For said third embodiment and/or for the corresponding materials, also what has been described in regard to the previous examples of embodiment is to be considered.

It hence will be appreciated that, in this embodiment, the very circuit support 4a defines, in its central region provided with the detection elements 3c, the membrane of the sensor, subjected to elastic deformation under the pressure of the fluid to be measured. Such a version of sensor could advantageously be used for low-pressure sensors; however, high-pressure sensors are not to be excluded, with the use in particular of tapes of greater thickness.

For this purpose, the tape 1 and/or the basic circuit 4 could have a thickness such as to withstand directly the stresses of the pressure, it possibly having indicatively a thickness comprised between 0.1 mm and 5 mm, preferably a thickness comprised between 0.2 mm and 2 mm, and in any case such as to be able to bend or undergo elastic deformation under the pressure of a fluid.

In addition to the advantages of the invention already mentioned previously, this embodiment enables a reduction of the production costs, a simpler processing to obtain the body 10' and a greater repeatability of the characteristic parameters of the sensor thanks to the fact that the membranes are all of the same thickness and shape. It should be considered, for example, that in the pressure sensors with ceramic body the corresponding process of baking or sintering leads to different thicknesses of the membrane 12, with the consequent need for machining or lapping of the individual supporting body, to obtain the desired thickness of the membrane, with relatively high costs; this machining or lapping operation moreover only enables membranes of a plane type to be obtained, with consequent design limits.

FIGS. 19-26 illustrate a fourth embodiment of the invention, according to which the membrane of the sensor and the corresponding detection means are integrated in one and the same component, such as a chip or a die of semiconductor material.

Also provided in this embodiment is a supporting body, which can be indifferently made of electrically insulating material or electrically conductive material. In the example represented in FIGS. 19-26, said body, designated as a whole by 10", has a shape generally similar to that of the bodies 10 of the first two embodiments. Said shape on the other hand is not essential. What counts is that in this embodiment the supporting body 10" has a passage 11", designed for providing a pressure port, which opens out on a substantially flat 10a" of the body itself.

In this embodiment, the circuit 4 is obtained according to the modalities already described previously, with the deposition of the paths 3a and of the terminals 3b, for example via serigraphy or jet deposition, which is followed by the drying step. In this case, in the step of singulation of the tape 1 on which the circuit patterns 3 have been serigraphed (see FIG. 2), each circuit support 4a is provided with at least one respective opening or window; in the example represented in FIG. 21, such a window, designated by 4b, is in a central position of the circuit support 4a. The window can evidently be obtained by the shearing or punching that is carried out in the singulation step.

Figure 22:
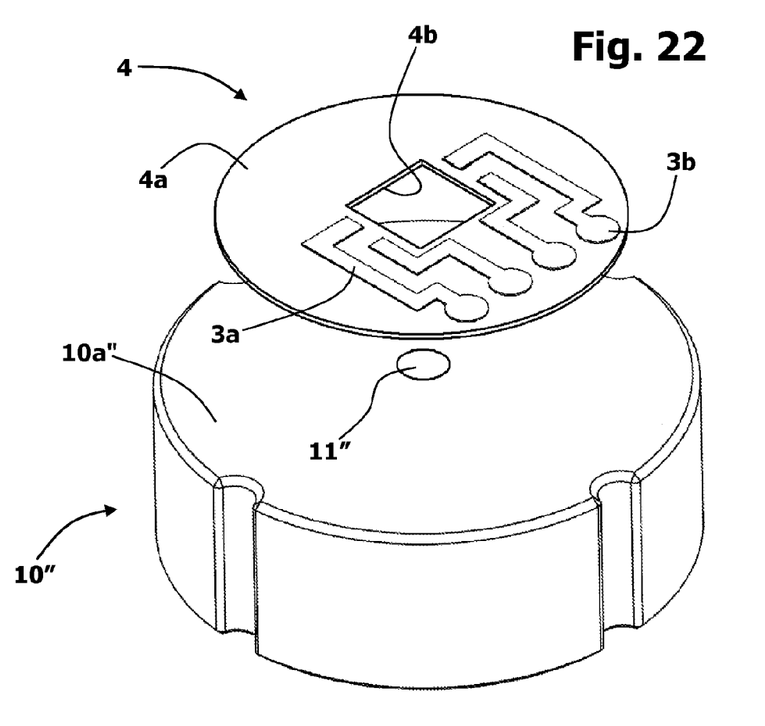
FIGS. 22-23 are views similar to those of FIGS. 6-7 and 11-12, corresponding to the sensor in accordance with the aforesaid fourth embodiment of the invention.
Figure 23:
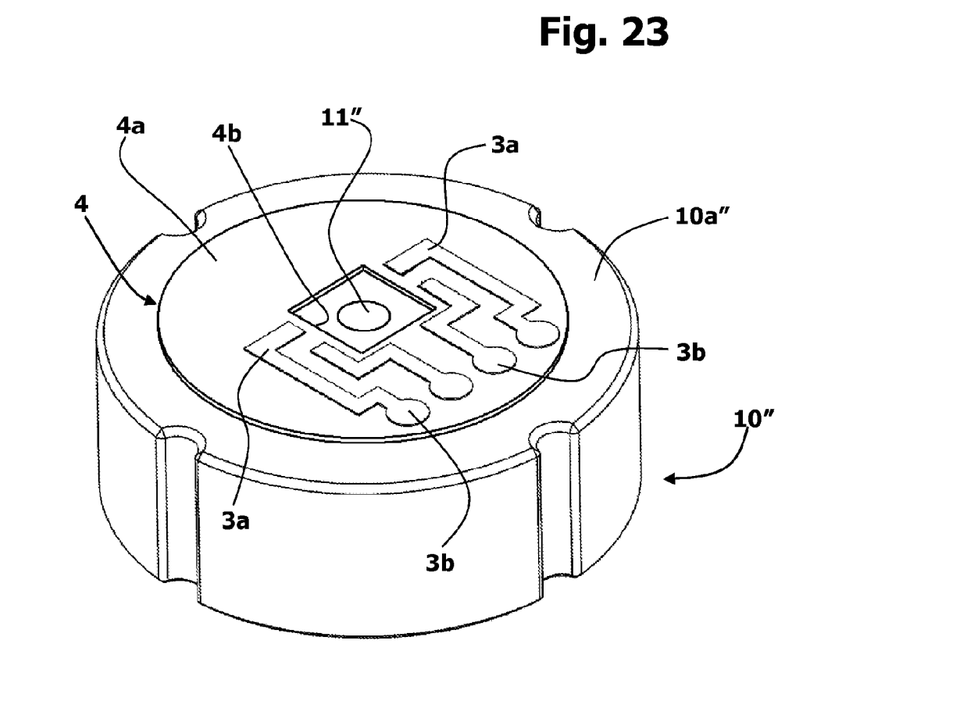

Next, as exemplified in FIGS. 22 and 23, the circuit 4 is laminated on the flat face 10a" of the body 10", with the modalities already described previously, so that the window 4b is preferably but not necessarily coaxial to the passage 11". The dimensions of the window 11" are such as to delimit and leave exposed a region of the face 10a", located within which is the top end of the passage 11", as is clearly visible in FIG. 23.

Figure 24:
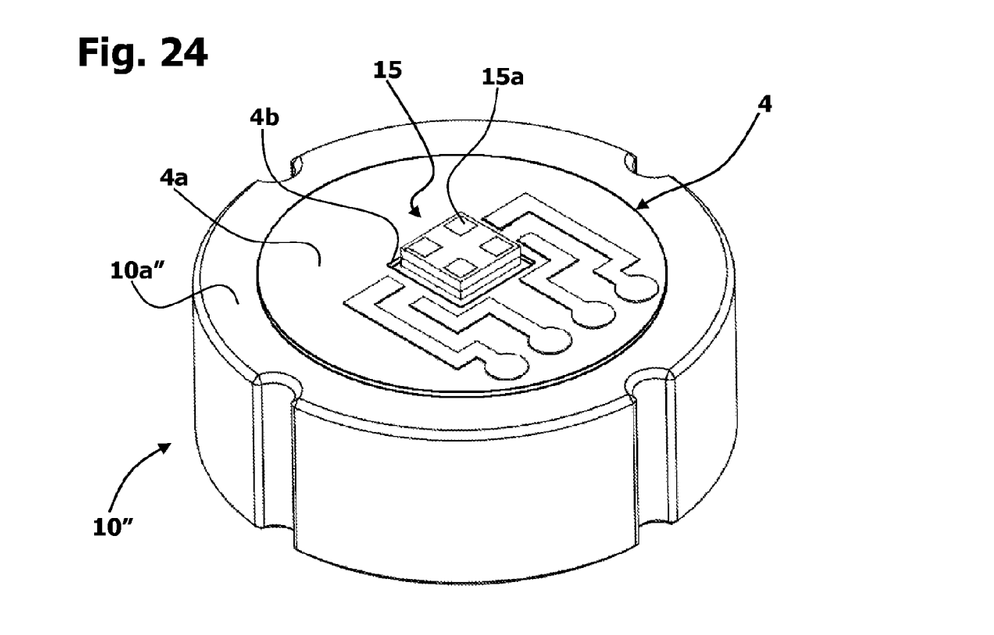
FIGS. 24-25 are schematic illustrations of two further steps of manufacture of the sensor in accordance with the aforesaid fourth embodiment of the invention.

After the baking step, mounted in said region is a die, designated by 15 in FIG. 24. The example illustrated regards the case of a die, namely a small block or chip of semiconductor material, typically silicon, with a possible glass base, which is die-bonded to the substrate constituted by the top face 10a" of the body 10". The adhesion and sealing between the die 15 and the face 10a" is, for example, performed via at least one layer of gluing material, designated by 16 only in FIG. 26. In one embodiment, the die is rendered fixed with respect to the face 10a" using for the at least one layer 16 a vitreous glue (even though other types of adhesives may be used, such as an epoxy resin).

Preferably made directly in miniaturized form in the die 15 is the integrated circuit that supervises general operation of the pressure sensor. As may be seen from FIG. 26, defined in the body made of semiconductor material is a blind cavity 15', which has one end open on the bottom face of the die itself. The opposite end of the cavity 15' is closed by a membrane portion 15", defined by the die itself on its top face.

In the example illustrated, the die 15 is configured as a single chip or block of silicon having a quadrangular cross section, but said embodiment is not to be understood as limiting, it being possible for the die 15 to have shapes different from the one illustrated and be formed by a plurality of parts or layers joined together. The die 15 can be obtained with a technique in itself known in the sector of production of semiconductor chips. Preferably the die 15 is without a casing or package of its own, and hence without corresponding projecting connection terminals (pins or leads), typically constituted by relatively rigid metal elements. Affixed directly on the top face of the die 15 are contacts, some of which are designated by 15a in FIG. 24, in the form of thin films of electrically conductive material deposited on the die. The material of the contacts 15a preferably but not necessarily has a base of one or more noble materials, such as for example gold; preferred materials or alloys that can be used for the purpose may comprise gold, platinum, palladium, beryllium, silver, but also aluminium, silicon, and copper.

Figure 25:
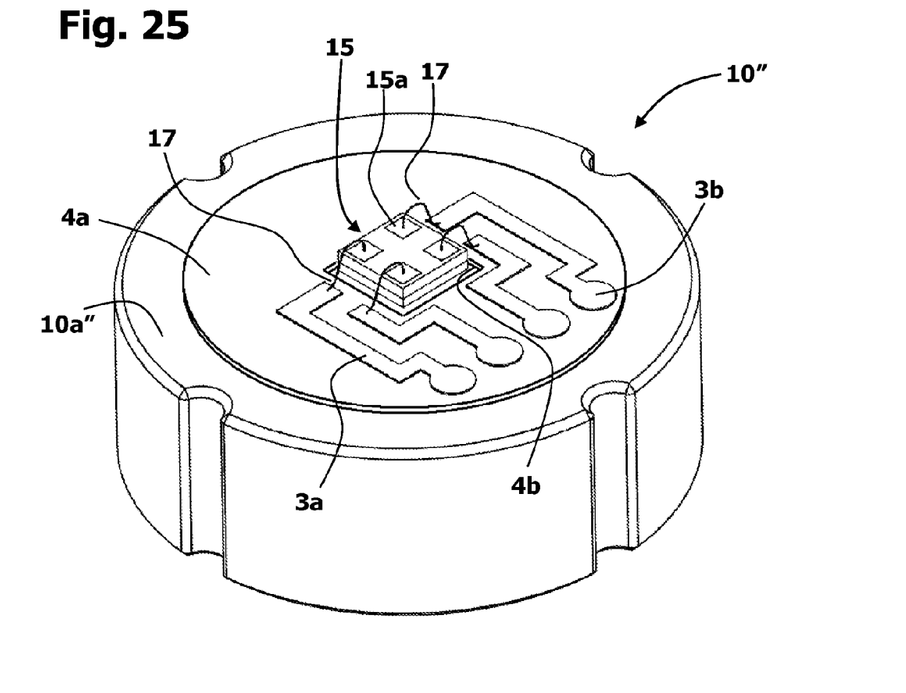
Figure 26:
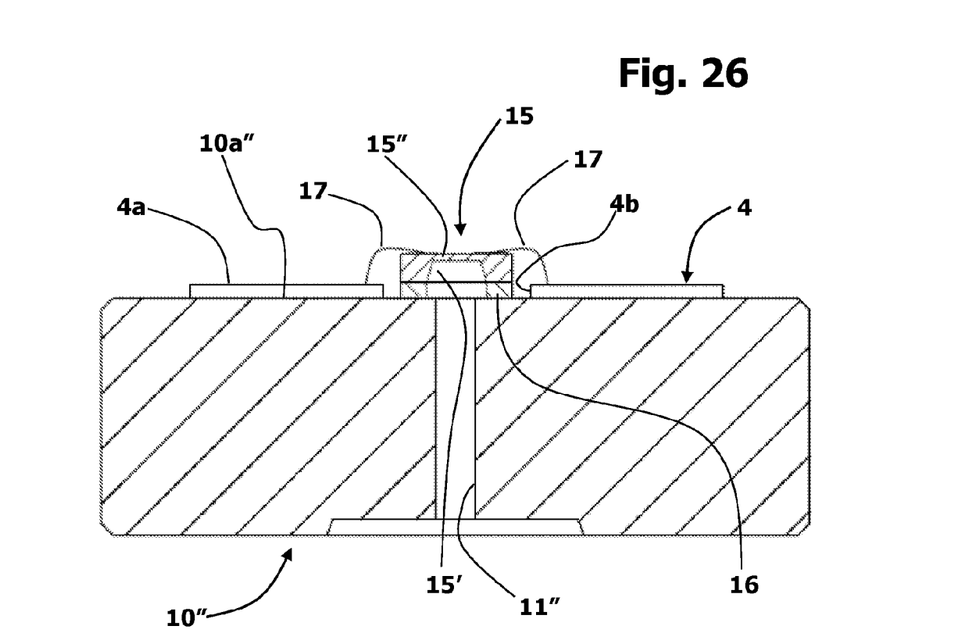
FIG. 26 is a schematic cross-sectional view of the sensor resulting from the step of FIG. 25.

As may be noted from FIGS. 24-26, the die 15 is mounted on the face 10a" of the body 10" at the opening of the passage 11", with the open end of the cavity 15' facing said opening (see FIG. 26).

After gluing of the die 15 in position, with corresponding baking of the semifinished product, the die itself is connected electrically to the circuit 4. The connection of the contacts 15a of the die 15 to corresponding paths 3a of the circuit 4 is obtained via added flexible contact elements, constituted by thin wires of electrically conductive material, in particular flexible micro-wires having a thickness or diameter comprised approximately between 5 and 100 μm, preferably from approximately 25 μm to approximately 35 μm. The wires, some of which are designated by 17 in FIGS. 25 and 26, are preferably but not necessarily with a base of one or more noble metals, as indicated for the contacts 15a. The microwires 17 are soldered or in any case connected between the contacts 15a and the paths 3a using processes of the type known generically as "wire bonding", and in particular of the "wedge-bonding" or else "ball-bonding" type, for example via thermocompression, or ultrasound soldering, or thermosonic soldering. The sensor is hence as appears in FIGS. 25 and 26.

This embodiment enables the same advantages already highlighted previously to be achieved, in relation to simplification of the deposition of the material or materials used for producing the circuit, and the absence of glues or adhesives for fixing the circuit support 4a to the body 10".

It should be noted, also with reference to the other embodiments, that the solution according to the invention prevents the risks of degradation of glues at high temperature (in so far as no glue is present), for example in the use of the sensor or in the course of its production. Also the fact that the tape 2 is preferably ceramic-based or oxide-based is advantageous in the case of high operating temperatures of the sensor. The already mentioned dimensional stability and fixing stability of the circuit support are moreover particularly advantageous in the case of sensors that include semiconductor dice connected via wire bonding to the circuit 4 by virtue of the fact that any potential displacement between the two parts, which is typical instead of a gluing step or else is due to expansion or deformation of materials at high temperature, is avoided.

From the foregoing description the characteristics of the present invention emerge clearly, as likewise do its advantages. For a person skilled in the sector it is clear that numerous variations to the sensor and to the method described herein are possible, without thereby departing from the scope of the invention as defined in the annexed claims.

As explained previously, the invention finds application also in the case of sensors other than pressure sensors, and in general in those sensors the structure of which include a supporting body, connected to which is a circuit support, formed on which is a plurality of circuit components. Sensors of this sort may for example be load sensors or load cells, or sensors for detecting characteristics of a gas or a liquid other than the pressure, such as sensors with electrodes or resistors (where the dielectric and/or the capacitance or else the resistance vary as a function of the fluid in contact), hot-wire flow sensors (where a resistive element is heated, so that the variation of current that circulates in the element itself when affected by a flow of fluid is then detected), humidity sensors (with electrodes/capacitance or resistance that vary as a function of the humidity), and so forth.

The invention claimed is:

1. A method for the production of a plurality of sensors, in particular pressure sensors, comprising the operations of:
   i) providing a plurality of supporting bodies;
   ii) providing a plurality of circuit arrangements, each circuit arrangement comprising circuit components, amongst which detection means for generating electrical signals representing a quantity to be detected;
   iii) providing a plurality of circuit supports, each having a surface formed on which is a plurality of said circuit components, amongst which electrically conductive paths, and
   iv) connecting each circuit support to a respective supporting body,
   wherein:
   operation i) comprises the step of
   a) forming each of said supporting bodies with a cavity and defining in the supporting bodies, at a respective first face, a non-deformable peripheral portion and a central elastically deformable membrane portion which closes said cavity at an end thereof;
   operations ii) and iii) comprise the steps of
   b) providing a tape made of electrically insulating material, in particular a dielectric material;
   c) depositing, on a length of the tape, one or more materials necessary for formation of a plurality of circuit patterns, each including a plurality of said circuit components;
   d) subjecting to drying the length of tape bearing the plurality of circuit patterns;
   e) subjecting the length of the tape to singulation, namely to removal from the length itself of individual subportions thereof, each including a respective circuit pattern, each subportion forming one said circuit support;
   operation iv) comprises the step of:
   f) fixing via lamination each circuit support on the first face of a corresponding supporting body, in particular via a hot lamination, or a compression, with subsequent baking, in such a way that a region of the circuit support is superimposed to the membrane portion of the respective supporting body, said region including some of said circuit components.

2. The method according to claim 1, wherein, after step f), further comprising the step of:
   g) depositing, on each circuit support laminated on the corresponding supporting body, one or more materials necessary for formation of one or more further circuit components, with possible subsequent drying.

3. The method according to claim 2, wherein step c) and/or step g) are carried out via serigraphy or jet deposition.

4. The method according to claim 1, wherein step b) comprises forming the tape made of electrically insulating material
   with a dielectric material with a base of one or more oxides and/or ceramic components, in particular selected from among aluminium oxides, silica, zinc oxides, zirconium silicate, frits or powdered glass, and/or
   with a thickness comprised between approximately 0.05 mm and approximately 1 mm, in particular a thickness comprised between approximately 0.05 mm and approximately 0.3 mm.

5. The method according to claim 1, wherein step a) comprises forming the supporting bodies with electrically insulating material, such as a ceramic material, glass, a polymer, a material with a base of one or more oxides, such as an aluminium oxide ($AL_2O_3$).

6. The method according to claim 1, wherein step a) comprises forming the supporting bodies with an electrically conductive material, such as a metal or a conductive polymer.

7. The method according to claim 1, wherein step a) comprises forming the supporting bodies as monolithic supporting bodies.

8. A method for the production of a plurality of sensors, in particular pressure sensors, comprising the operations of:
   i) providing a plurality of supporting bodies;

ii) providing a plurality of circuit arrangements, each circuit arrangement comprising circuit components, amongst which detection means for generating electrical signals representing a quantity to be detected;

iii) providing a plurality of circuit supports, each having a surface formed on which is a plurality of said circuit components, amongst which electrically conductive paths, and iv) connecting each circuit support to a first face of a respective supporting body, wherein:

operation i) comprises the step of a) forming each of said supporting bodies with a substantially flat first face and a through-passage with one end thereof that opens at the first face, operations ii) and iii) comprise the steps of b) providing a tape made of electrically insulating material, in particular a dielectric material;

c) depositing, on a length of the tape, one or more materials necessary for formation of a plurality of circuit patterns, each including a plurality of said circuit components;

d) subjecting to drying the length of tape bearing the plurality of circuit patterns;

e) subjecting the length of tape to singulation, namely to removal from the length itself of individual subportions thereof, each including a respective circuit pattern, each subportion forming one said circuit support;

wherein in the length of the tape a plurality of through-openings are formed, each at a respective circuit pattern, such that each circuit support has a respective through-opening, operation iv) comprises the step of:

f) fixing via lamination each circuit support on the first face of a corresponding supporting body, in particular via a hot lamination, or a compression, with subsequent baking;

wherein after step f), on said first face of each supporting body a chip or die is mounted, at a region circumscribed by the through-opening of the corresponding circuit support, in which the respective through-passage opens.

9. The method according to claim 8, wherein, after step f), further comprising the step of:

g) depositing, on each circuit support laminated on the corresponding supporting body, one or more materials necessary for formation of one or more further circuit components, with possible subsequent drying.

10. The method according to claim 9, wherein step c) and/or step g) are carried out via serigraphy or jet deposition.

11. The method according to claim 8, wherein step b) comprises forming the tape made of electrically insulating material with a dielectric material with a base of one or more oxides and/or ceramic components, in particular selected from among aluminium oxides, silica, zinc oxides, zirconium silicate, frits or powdered glass, and/or with a thickness comprised between approximately 0.05 mm and approximately 1 mm, in particular a thickness comprised between approximately 0.05 mm and approximately 0.3 mm.

12. The method according to claim 8, also comprising connecting the die to conductive paths of the respective circuit support via wire bonding, namely via thin connection wires made of electrically conductive material, in particular flexible micro-wires having a thickness or diameter comprised between approximately 5 and 100 μm, preferably from approximately 25 μm to approximately 35 μm.

13. The method according to claim 8, wherein step a) comprises forming the supporting bodies with electrically insulating material, such as a ceramic material, glass, a polymer, a material with a base of one or more oxides, such as an aluminium oxide ($AL_2O_3$).

14. The method according to claim 8, wherein step a) comprises forming the supporting bodies with an electrically conductive material, such as a metal or a conductive polymer.

15. The method according to claim 8, wherein step a) comprises forming the supporting bodies as monolithic supporting bodies.

16. A sensor obtained through the method according to claim 1, having:

a structure, which comprises a supporting body;

a circuit arrangement, comprising circuit components, amongst which detection means for generating electrical signals representing a quantity to be detected; and at least one circuit support, laminated on a first face of the supporting body and having a surface formed on which is a plurality of said circuit components, amongst which electrically conductive paths, wherein the quantity to be detected is the pressure of a fluid and the detection means comprise a membrane which is elastically deformable depending on the pressure of the fluid, said supporting body is a supporting body having an overall cylindrical shape, with a blind cavity which is closed at one end by said membrane, said membrane being defined by the supporting body at said first face, and the detection means are formed in a region of the circuit support that is laminated on top of the membrane.

17. A sensor obtained through the method according to claim 8, having:

a structure, which comprises a supporting body;

a circuit arrangement, comprising circuit components, amongst which detection means for generating electrical signals representing a quantity to be detected; and at least one circuit support on a first face of the supporting body and having a surface formed on which is a plurality of said circuit components, amongst which electrically conductive paths, wherein the quantity to be detected is the pressure of a fluid and the detection means comprise a membrane which is elastically deformable depending on the pressure of the fluid, wherein the detection means, including said membrane, are integrated in a die with a base of semiconductor material, in particular silicon, wherein the circuit support has a through-opening and the supporting body is a supporting body with a through-passage having one end that opens at the first face, in a region thereof delimited by the through-opening of the circuit support, and wherein the die is mounted on the first face of the supporting body at said end of the passage, within said region delimited by the through opening of the circuit support, wherein said first face is a substantially flat face of the supporting body onto which the circuit support is laminated.

* * * * *